United States Patent
Dukhan et al.

(10) Patent No.: US 6,401,463 B1
(45) Date of Patent: Jun. 11, 2002

(54) COOLING AND HEATING SYSTEM FOR AN EQUIPMENT ENCLOSURE USING A VORTEX TUBE

(75) Inventors: Nihad Dukhan, Chicago; Mark Cress, Bensenville; Michael R. Cosley, Crystal Lake, all of IL (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/725,539

(22) Filed: Nov. 29, 2000

(51) Int. Cl.$^7$ ................................................ F25B 9/02
(52) U.S. Cl. .................................. 62/5; 62/238.2
(58) Field of Search ...................... 62/5, 3.61, 238.2

(56) References Cited

U.S. PATENT DOCUMENTS

| | | |
|---|---|---|
| 1,952,281 A | 3/1934 | Ranque |
| 2,698,525 A * | 1/1955 | Lindenblad ................. 62/238.2 |
| 2,920,457 A | 1/1960 | Bartlett, Jr. |
| 2,943,452 A * | 7/1960 | Buchanan ................. 62/238.2 |
| 3,173,273 A | 3/1965 | Fulton |
| 3,208,029 A | 9/1965 | Fulton |
| 3,327,495 A | 6/1967 | Ergenc |
| 3,581,509 A * | 6/1971 | Manka ............................ 62/5 |
| 3,630,040 A | 12/1971 | Goldfarb |
| 3,654,768 A | 4/1972 | Inglis et al. |
| 3,899,684 A * | 8/1975 | Tenney ............................ 62/5 |
| 3,922,871 A | 12/1975 | Bolesta |
| 4,240,261 A | 12/1980 | Inglis |
| 4,333,017 A | 6/1982 | O'Connell |
| 4,407,134 A | 10/1983 | Snaper |
| 4,594,084 A | 6/1986 | Lopez |
| 4,914,752 A | 4/1990 | Hinson et al. |
| 5,010,736 A | 4/1991 | York et al. |
| 5,331,817 A | 7/1994 | Anthony |
| 5,542,413 A | 8/1996 | Horn |
| 5,685,475 A | 11/1997 | Jairazbhoy et al. |
| 5,901,572 A | 5/1999 | Peiffer et al. |
| 6,033,517 A | 3/2000 | Chenetski |

\* cited by examiner

Primary Examiner—Ronald Capossela
(74) Attorney, Agent, or Firm—Jones, Day, Reavis & Pogue

(57) ABSTRACT

A cooling and heating system using a vortex tube is disclosed. The system is attached to an equipment enclosure used for telecommunications, cable television and the like where a cold airstream from the vortex tube is directed to the sealed upper chamber of the enclosure, the upper chamber typically containing heat generating electronic components. The hot airstream generated by the vortex tube can be used to maintain an elevated temperature which prolongs the life of certain batteries and enhances their efficiency. Cold plates, heat exchangers, air jets and the like may be used in conjunction with the vortex tube to increase the cooling or heating of preselected components or items.

7 Claims, 3 Drawing Sheets

COOLING AND HEATING SYSTEM FOR AN EQUIPMENT ENCLOSURE USING A VORTEX TUBE

BACKGROUND OF THE INVENTION

1. Field of the Invention

The present invention relates to a cooling and heating system and more particularly to a cooling and heating system for outdoor enclosures, where the system employs a vortex tube.

2. Description of the Related Art

Free standing outdoor enclosures for telecommunications and cable television equipment typically need cooling of the internal electronic components. On the other hand, some items, such as batteries may benefit from added heat in cold climates to cause more efficient operation and to increase useful life. Certain types of batteries are optimized by maintaining their temperature at 77° F. Hence, depending upon ambient temperature, such batteries may benefit from heating at times and cooling at other times. Typically, outdoor electronic enclosures in the past have been cooled by air conditioning, thermal electric coolers, heat exchangers and fans. These systems, however, may be expensive, bulky, short lived and/or environmentally hostile. Also, past systems are directed to macro level cooling.

Vortex tubes are well known devices to those skilled in the art and are explained in a number of earlier U.S. patents including U.S. Pat. Nos.: 1,952,281; 2,920,457; 3,173,273; 3,208,229; 3,654,768; 4,240,261; and 5,331,817, the disclosures of all of which are included herein by reference. As explained in these patents, a vortex tube is a device having no moving parts. When fed with compressed air, the vortex tube emits a stream of cold air from one end and a stream of hot air from the other end. There can be enough of a temperature difference between the two airstreams to freeze water with the cold air stream and to boil water with the hot airstream. In operation the compressed air enters a nozzle which injects the air tangentially into a vortex generating chamber. The chamber is positioned intermediate of the hot and cold ends of the vortex tube but closer to the cold end than the hot end. The air vortex created moves through the tube toward the hot end but a sufficient back pressure is developed to force some of the air toward the center of the tube and then back in the opposite direction. This back flow becomes very cold as it passes through the vortex tube and it forms the cold airstream. An obvious benefit of using a vortex tube is the environmental friendliness of the refrigerant, ordinary air. Also, the refrigerant is free and the vortex tube is a reliable machine.

Vortex tube cooling systems, however, are not as efficient as ordinary refrigeration units. Also, vortex tube systems are noisy and add more inefficiencies if the necessary air compressor is located at a distance from the vortex tube.

BRIEF SUMMARY OF THE INVENTION

The present invention overcomes some of the problems of the past by providing a very efficient and compact cooling and heating system employing a vortex tube comprising an enclosure having first and second chambers and items therein to be cooled and/or heated, a vortex tube with a hot exhaust and a cold exhaust, the vortex tube being operatively connected to the enclosure, a compressed gas source operatively connected to the vortex tube wherein the vortex tube cold exhaust is connected to the first chamber in the enclosure and the vortex tube hot exhaust is connected to the second chamber in the enclosure.

An object of the present invention is to provide a cooling and heating system employing a vortex tube which is compact, lightweight, self contained, relatively inexpensive and usable outdoors. Another aim of the present invention is to provide a cooling and heating system using a vortex tube where the hot airstream is put to use instead of being dissipated to the ambient environment. Still another advantage of the present invention is to provide a cooling and heating system using a vortex tube with an environmentally friendly refrigerant, such as air. Yet another aspect of the present invention is to provide a cooling and heating system employing a vortex tube which is relatively quiet, relatively inexpensive and reliable. A still further object of the present invention is to provide a cooling and heating system using a vortex tube that can switch between heating and cooling as dictated by climate, is scalable by changing compressors and/or vortex tubes, is flexible in the range of heating and cooling available, and is operable using AC or DC power.

A more complete understanding of the present invention and other objects, aspects, aims and advantages thereof will be gained from a consideration of the following description of the preferred embodiments read in conjunction with the accompanying drawing provided herein.

DETAILED DESCRIPTION OF THE INVENTION

Figure 1:
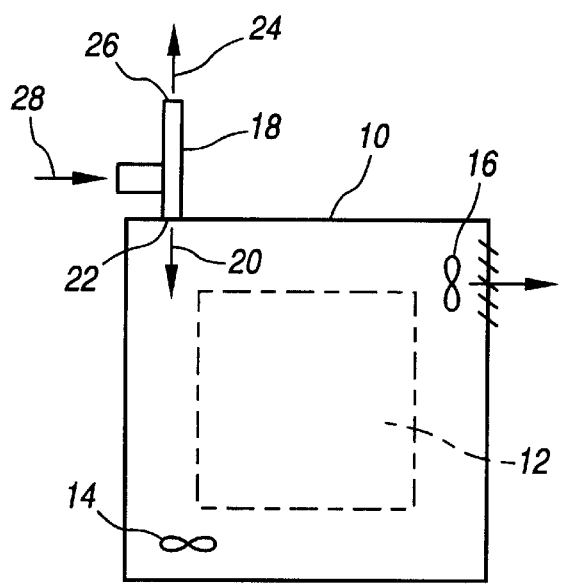
FIG. 1 is a diagrammatic view of a prior art electronics enclosure cooled by a vortex tube.

While the present invention is open to various modifications and alternative constructions, the preferred embodiments shown in the drawing will be described herein in detail. It is understood, however, that there is no intention to limit the invention to the particular forms disclosed. On the contrary, the intention is to cover all modifications, equivalent structures and methods, and alternative constructions falling within the spirit and scope of the invention as expressed in the appended claims.

Referring to FIG. 1, there is illustrated a prior art vortex tube cooling device used for cooling electronic components, while dissipating a hot airstream generated by the vortex tube to the ambient environment. What is shown is an enclosure 10 having various heat generating electronic components 12 mounted within the enclosure. Fans 14,16 may be located within the enclosure for circulating and expelling air. For example, the fan 14 may be used to circulate air within the enclosure while the fan 16 is used to expel warm air from the enclosure. Generally, the enclosure is substantially sealed so as to prevent moisture, contaminants and adverse climatic conditions from unduly effecting the sensitive electronic components.

A vortex tube 18 is mounted to the enclosure such that a cold air stream represented by the arrow 20 emanating from a cold air exhaust 22 is directed into the enclosure. A hot airstream represented by the arrow 24 emanating from a hot air exhaust 26 is dissipated to the ambient environment. The input to the vortex tube 18 is compressed air represented by the arrow 28. The compressed air divides into two airstreams due to the geometry of the interior of the vortex tube. Georges Joseph Ranque of France is credited with being the inventor of the vortex tube and his device is explained in his 1934 U.S. Pat. No. 1,952,281. The problem with the prior art cooling device is that the hot airstream is dissipated to the ambient environment, the device is noisy and the compressor generating the compressed air is removed from the vortex tube.

The features of the present invention include a compact, self-contained arrangement suitable for use outdoors. Also, the hot airstream from the vortex tube is used and the arrangement reduces the noise generated by this hot airstream. Further, the system is reliable, relatively low in cost and environmentally friendly because the working fluid or refrigerant is ordinary air.

Figure 2:
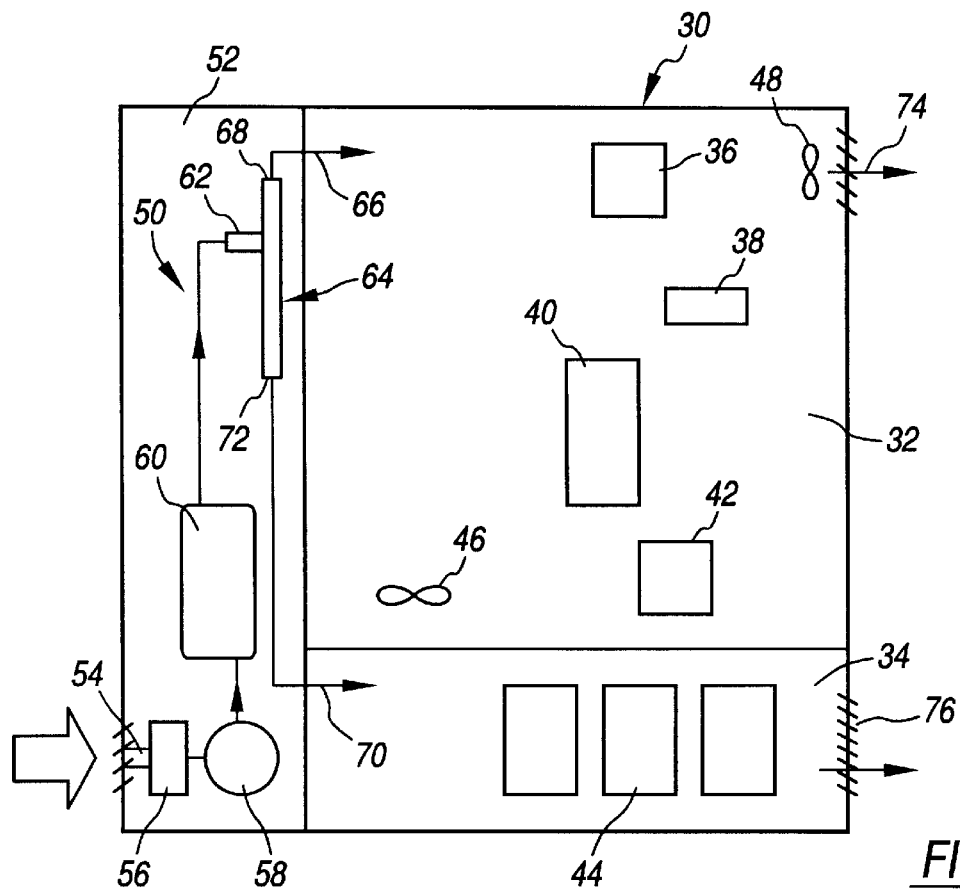
FIG. 2 is a diagrammatic view of a vortex tube cooling and heating system of the present invention.

The present invention is understood by reference to FIG. 2. There is illustrated an outdoor enclosure 30 such as those used for telecommunications equipment where the enclosure includes an upper chamber 32 and a lower chamber 34. The upper chamber contains heat generating electronic components 36, 38, 40, 42 while the lower chamber 34 contains a series of batteries, such as the battery 44. The upper chamber may also include a circulation fan 46 and an exhaust fan 48. The batteries serve the purpose of operating the components even if there is an interruption of commercial power.

The cooling and heating system 50 of the present invention is shown in a third chamber 52 although it is understood that the cooling and heating system may be placed in the lower chamber 34 if desired. It is to be noted that outdoor enclosures or cabinets may consist of several chambers, such as combinations of a sealed upper chamber, a vented lower battery chamber, a vented lower fuel cell chamber or vented side and/or back chambers. The cooling/heating system of the present invention may be placed in the lower chamber, a side chamber or a back chamber because of its relatively small and compact size. It is also to be understood that the cooling/heating system may even be housed in its own enclosure or cabinet adjacent an equipment enclosure. It is to be noted that if the upper chamber is sealed, the exhaust fan 48 is eliminated or it may be used to recirculate air to an air inlet of a compressor as will be explained below.

The system 50 includes an air inlet 54, a air filter and dryer 56 and a compressor 58. The air from the compressor is then stored in a tank 60 which is connected to an inlet 62 of a vortex tube 64. A cold airstream represented by the arrow 66 emerges from a cold air exhaust 68 and is directed into the upper chamber 32 for cooling the electronic components. A hot airstream represented by the arrow 70 emerges from a hot air exhaust 72 of the vortex tube and this airstream is introduced into the lower battery chamber 34.

The ambient air is cleaned and dried by the filter and dryer 56 in a manner know to those skilled in the art. The air compressor 58 is relatively small but has sufficient capacity in terms of pressure and flow rate to ensure cooling of the electronic components and good performance of the vortex tube. The compressor provides the compression and pumps the air into the tank 60 which is used to build up the air pressure and to maintain a constant supply of compressed air. There is also a slight bit of air cooling that occurs in the tank. From the tank the compressed air flows into the intake 62 of the vortex tube which should be of a suitable size consistent with the heating and cooling needs of the particular components and batteries and the size of the enclosure chambers. After heat is picked up from the electronic component chamber 42 and/or after warming the batteries in the lower chamber 44, the two airstreams may be exhausted to the surrounding ambient environment through appropriate vents 74, 76 in the enclosure, or the upper airstream can be recirculated to the air inlet 54 for the compressor 58 if the chamber 32 is sealed. In such a circumstance, the vent 74 is eliminated.

Another advantage of the present cooling/heating system is that it may use a DC compressor to insure that cooling and heating occur even if there is a loss of commercial power. In other words, the compressor may be powered by the batteries. It is to be noted that the use of the inventive cooling/heating system overcomes the lack in the market place of a small scale expansion device for small scale compressed air systems. The smallest turbo expander available is 18 inches in diameter and two feet long. It requires a flow rate of at least 200 cubic feet per minute (cfm) and has a rotational speed of a 120,000 revolutions per minute (rpm). Any smaller expander would require operation at still higher speeds which creates a lubrication and vibration problems and would in gender relatively high development costs. Also, high rotational speeds can reduce equipment life. Alternative systems tend to be heavy, bulky and expensive. Also, vapor compression cycles use refrigerants which may cause environmental damage. In addition such refrigerant units are not suited for operation with a DC backup. Furthermore, refrigeration units are usually packaged separately and thus not easily integrated with an equipment enclosure where space is at a high premium. Moreover, the heat generated by conventional system is wasted.

By way of example, a Marconi Mesa Sport brand enclosure nominally requires about 600 watts of cooling. This can be accomplished using a compressor operating at a flow rate of 30 cfm at a pressure of about 100 pounds per square inch. Such a compressor may be obtained from Scrollex Corporation of Willowbrook, Ill. and is known as Scrollex model MTA10H. A vortex tube from Exair Corporation of Cincinnati, Ohio, model 3230 may be matched with the compressor. The result is cooling to close to 0° C. or to a temperature that avoids frosting of the system and avoids impedance of flow through the system.

The compressor and vortex tube can be scaled and can be used flexibly to vary the cooling capacity of the system. A hot airstream at about 40° C. will provide the best performance and longest life for lithium-polymer type batteries and fuel cells.

Figure 3:
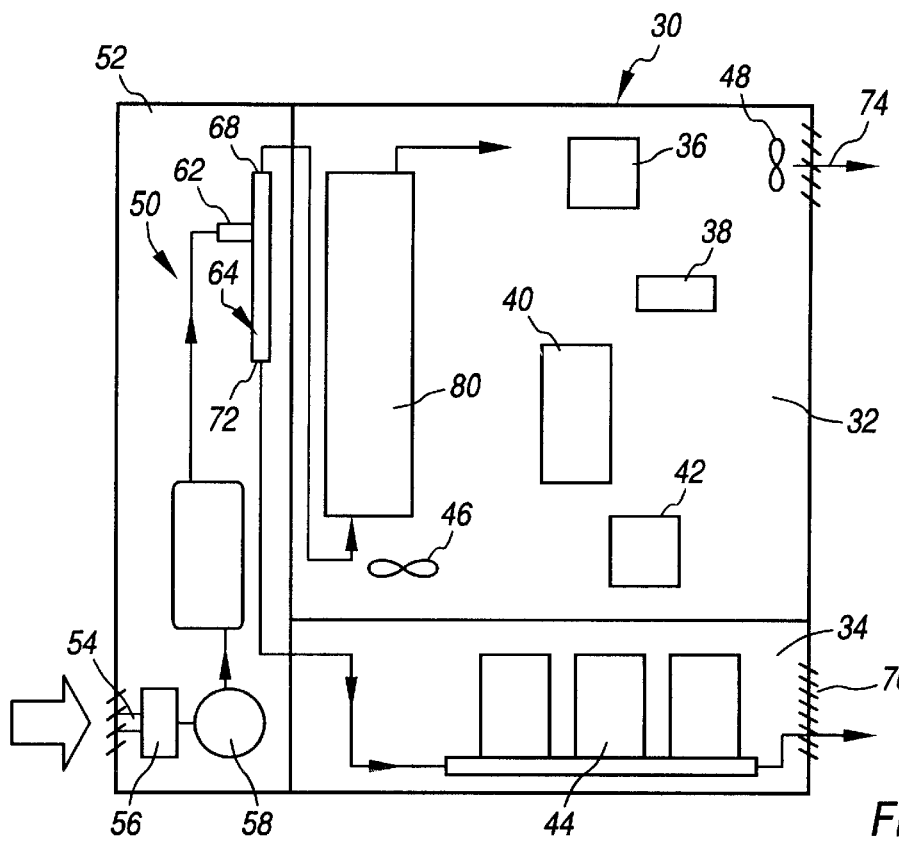
FIG. 3 is a diagrammatic view of another embodiment of the present invention illustrating the use of heat exchangers.

Referring now to FIG. 3, there is illustrated an enclosure and cooling/heating system where structures in FIG. 3 are designated by like numerals for like structures shown in FIG. 2. However, instead of introducing the air flows from the vortex tube directly into the upper and lower chambers of the enclosure as was done in the FIG. 2 embodiment, in the FIG. 3 embodiment the cold air exhaust 68 directs the air to the input of a heat exchanger 80. The cool air absorbs heat from the air of the upper chamber 32 before the air is exhausted to the ambient environment. Alternatively, the air in the chamber 32 may be fed to the heat exchanger and returned to the chamber while the former cold air from the vortex tube is exhausted to the ambient environment after it picks up heat in the exchanger. This allows the chamber 32 to be completely sealed. The hot air from the hot air exhaust 72 is directed to a heat exchanger 82 in the lower chamber 34. The heat exchanger 82 in the lower chamber may take the form of a thermally conductive plate upon which the batteries, such as the battery 44, are mounted. This allows for conductive heat transfer which is more efficient than the convection heat used with the FIG. 2 embodiment. Also, the conductive plate may be used with the cold air flow.

Figure 4:
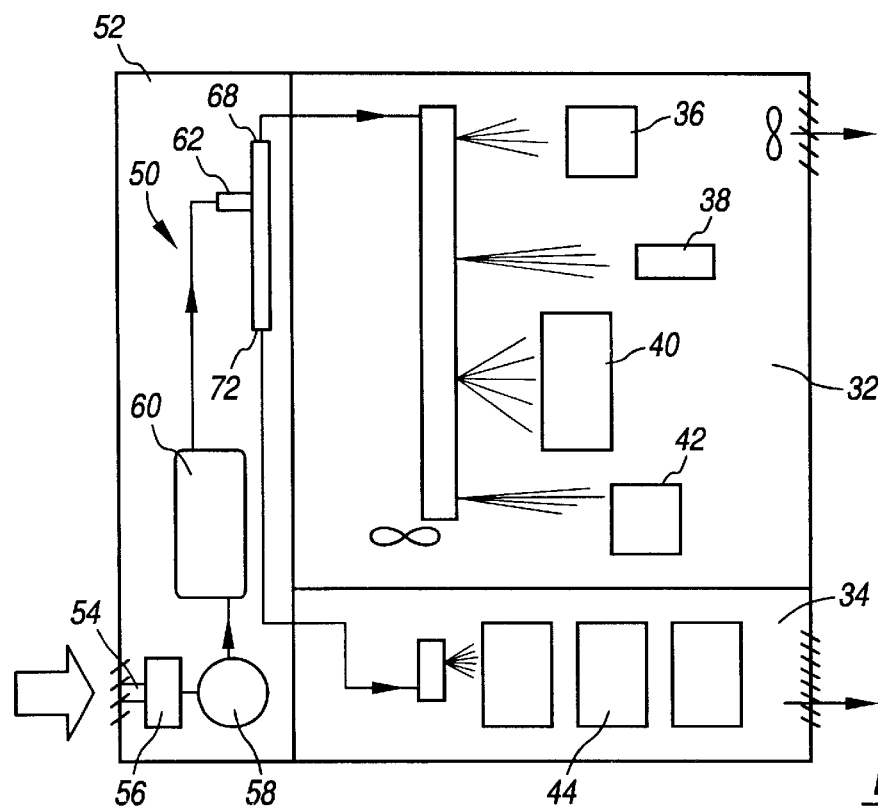
FIG. 4 is a diagrammatic view of still another embodiment of the present invention illustrating the use of air jets.

Referring now to FIG. 4, there is yet another embodiment of the enclosure and the cooling/heating system. Once again like structures in the FIGURES are identified by the same numerals as used in FIGS. 2 and 3. Instead of introducing the cold airstream directly into the upper chamber 32 as done in FIG. 2, or into a heat exchanger as done in FIG. 3, a conduit 90 is provided with preselected openings so as to form air jets. These openings can be placed adjacent specific electronic components, or nozzles may be used to direct a blast of air to the components so that these components are cooled to a lower temperature than the average temperature of the chamber. The same would be true of the FIG. 3 version where particular components can be placed, for example, on cold plates so that there is better heat transfer and the particular component can be brought to a lower temperature than the average temperature of the chamber in which the component is located.

Figure 5:
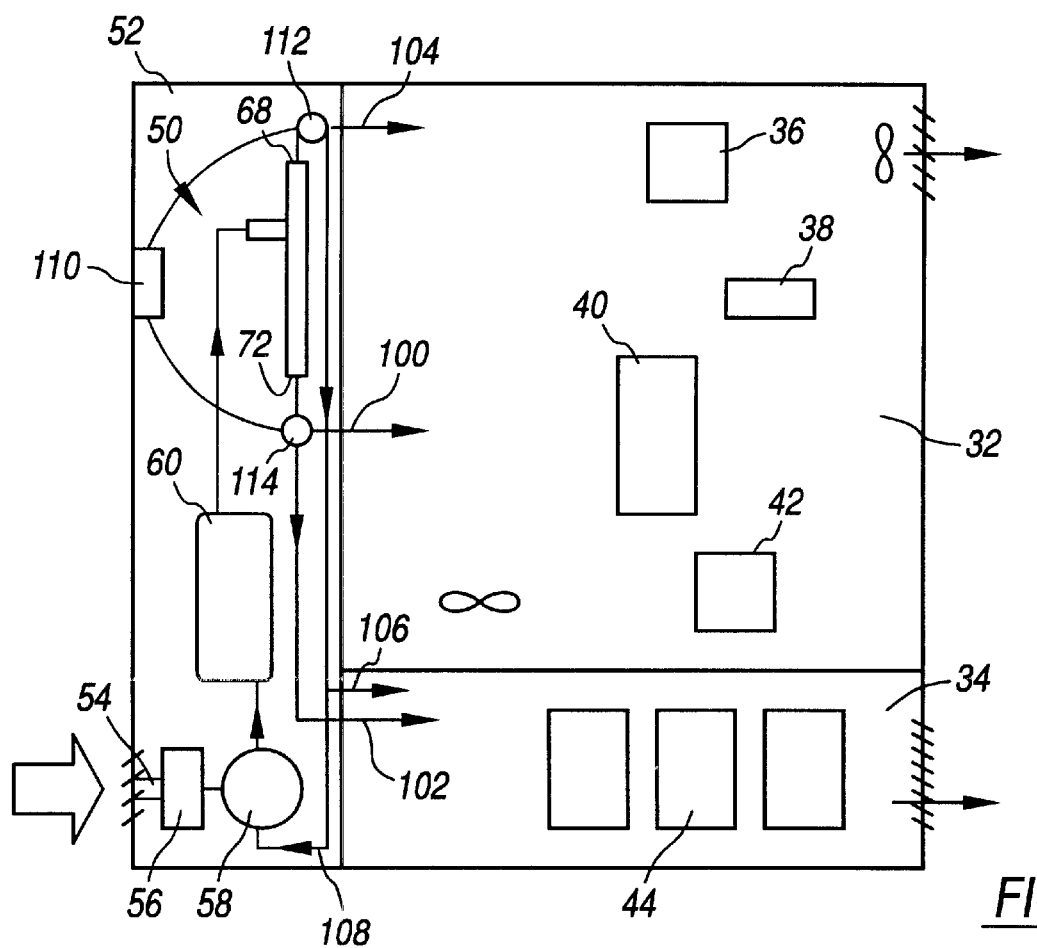
FIG. 5 is a diagrammatic view of yet another embodiment of the present invention illustrating the use of a vortex tube for heating and cooling depending on climatic conditions.

Another advantage of the present system is that the system can direct hot or cold air wherever it is desired or required due to changing climatic conditions. The system can also be automated so as to respond to climatic conditions. Referring now to FIG. 5, another embodiment of the present invention is shown where structures in FIG. 5 are designated with the same numerals as are used to designate like structures in FIGS. 2–4. The variation in FIG. 5 illustrates that the hot air flow from the hot air exhaust 72 may be directed to both the upper and the lower chambers 32, 34 by conduits 100 and 102, respectively. The same may be true of the cold airstream and/or the cold air may be used to cool the compressor 58. Conduit 104 runs to the upper chamber 32, conduit 106 runs to the lower chamber 34 and conduit 108 communicates with the compressor 58. Whether components are heated or cooled may depend upon the ambient temperature and climatic conditions, namely, whether the season is summer or winter. A temperature and/or humidity weather sensing device 110 may be used to regulate valves 112, 114 which determine whether a chamber is heated or cooled and to what temperature.

The specification describes in detail several embodiments of the present invention. Other modifications and variations will, under the doctrine of equivalents, come within the scope of the appended claims. For example, the flow rate and pressure may be varied to adjust the temperatures of the air emerging from the cold air and hot air exhausts. Also, various arrangements can be made with air jets and/or cold and hot plates and/or heat exchangers and the like depending upon the particular components to be cooled or heated and depending upon their location within the enclosure. The arrangement includes mixing and matching air jets, cold plates and the like. Also, the weather sensing device may be used to sense one or more weather related factors. All of these are considered to be equivalent structures. Still other alternatives will also be equivalent as will many new technologies. There is no desire or intention here to limit in any way the application of the doctrine of equivalents.

What is claimed is:

1. A cooling and heating system for an equipment enclosure employing a vortex tube comprising:

an equipment enclosure having a first components chamber and a second battery chamber and items therein to be cooled and/or heated;

a vortex tube with a hot exhaust and a cold exhaust, said vortex tube operatively connected to said component and battery chambers;

a compressed gas tank operatively connected to said vortex tube and in close proximity thereto;

a compressor operatively connected to said gas tank, said compressor having an inlet and an outlet;

an air filter and dryer connected to said inlet of said compressor; and wherein said vortex tube cold exhaust communicates with said first components chamber in said enclosure and said vortex tube hot exhaust communicates with said second battery chamber in said enclosure.

2. A system as claimed in claim 1 wherein:

said enclosure first chamber is sealed against the ambient environment and said enclosure second chamber is not sealed against the ambient environment.

3. a system is claimed in claim 1 including:

a first heat exchanger in said first chamber;

a second heat exchanger in said second chamber; and said cold exhaust is connected to said first heat exchanger and said hot exhaust is connected to said second heat exchanger.

4. A system is claimed in claim 1 including:

a first gas jet unit in said first chambers; and a second gas jet unit in said second chamber;

said cold exhaust is connected to said first gas jet unit and said hot exhaust is connected to said second gas jet unit.

5. A system as claimed in claim 1 wherein:

said vortex tube hot exhaust is connected to said second chamber; and said vortex tube cold exhaust is connected to said compressor.

6. A system is claimed in claim 1 including:

a weather sensing device connected to said enclosure;

a first valve connected to said enclosure to direct cold air from said cold exhaust to either said first or said second chamber;

a second valve connected to said enclosure to direct hot air from said hot exhaust to either said first or said second chamber; and means operatively connecting said weather sensing device to said first and said second valves for operating said first and said second valves.

7. A system is claimed in claim 1 wherein:

said compressor is powered by direct current.

* * * * *